(12) United States Patent
Libsch et al.

(10) Patent No.: US 11,476,238 B2
(45) Date of Patent: Oct. 18, 2022

(54) DENSE HYBRID PACKAGE INTEGRATION OF OPTICALLY PROGRAMMABLE CHIP

(71) Applicant: International Business Machines Corporation, Armonk, NY (US)

(72) Inventors: Frank Robert Libsch, White Plains, NY (US); Ali Afzali-Ardakani, Ossining, NY (US); James B. Hannon, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 413 days.

(21) Appl. No.: 16/867,695

(22) Filed: May 6, 2020

(65) Prior Publication Data

US 2021/0351169 A1 Nov. 11, 2021

(51) Int. Cl.
*H01L 25/16* (2006.01)
*H01L 23/66* (2006.01)
(Continued)

(52) U.S. Cl.
CPC ............ *H01L 25/167* (2013.01); *G02B 6/428* (2013.01); *G02B 6/4269* (2013.01);
(Continued)

(58) Field of Classification Search
CPC ............... H01L 25/167; H01L 23/3675; H01L 23/5386; H01L 23/66; H01L 24/16; H01L 24/81; H01L 25/165; H01L 33/483; H01L 33/58; H01L 33/62; H01L 33/642; H01L 2223/6627; H01L 2223/6694; H01L 2224/16227; H01L 2224/81815; H01L 2924/12041; H01L 2924/1451; H01L 2933/0066; H01L 2933/0075; H01L 24/13; H01L 2224/13101; H01L 2224/81801; H01L 2924/15174; H01L 27/11517; H01L 27/11563; H01L 2224/16225;
(Continued)

(56) References Cited

U.S. PATENT DOCUMENTS

| 4,707,725 A | 11/1987 | Ito |
| 4,888,630 A * | 12/1989 | Paterson ........... H01L 27/11502 257/295 |

(Continued)

FOREIGN PATENT DOCUMENTS

JP 2004/126088 A 4/2004

OTHER PUBLICATIONS

Chen, Zhi, et al., "Moving toward optoelectronic logic circuits for visible light: A chalcogenide glass singe-mode single-polarization optical waveguide switch", Applied Optics, Feb. 2017, 9 pages.

*Primary Examiner* — Victor A Mandala
(74) *Attorney, Agent, or Firm* — Harrington & Smith

(57) ABSTRACT

An interconnect for a semiconductor device includes: a carrier; a UV programmable chip mounted on the carrier using a first array of solder connections; a UV light source mounted on the carrier using a second array of solder connections, the UV light source being in optical communication with the UV programmable chip; and a plurality of transmission lines extending on or through the carrier and providing electrical communication between the UV programmable chip and the UV light source.

16 Claims, 5 Drawing Sheets

(51) Int. Cl.
*H01L 23/00* (2006.01)
*H01L 23/367* (2006.01)
*H01L 33/62* (2010.01)
*H01L 33/64* (2010.01)
*H01L 33/48* (2010.01)
*H01L 33/58* (2010.01)
*H01L 23/538* (2006.01)
*G11C 16/04* (2006.01)
*G02B 6/42* (2006.01)

(52) U.S. Cl.
CPC ........ *G02B 6/4279* (2013.01); *G11C 16/0416* (2013.01); *H01L 23/3675* (2013.01); *H01L 23/5386* (2013.01); *H01L 23/66* (2013.01); *H01L 24/16* (2013.01); *H01L 24/81* (2013.01); *H01L 25/165* (2013.01); *H01L 33/483* (2013.01); *H01L 33/58* (2013.01); *H01L 33/62* (2013.01); *H01L 33/642* (2013.01); *H01L 2223/6627* (2013.01); *H01L 2223/6694* (2013.01); *H01L 2224/16227* (2013.01); *H01L 2224/81815* (2013.01); *H01L 2924/12041* (2013.01); *H01L 2924/1451* (2013.01); *H01L 2933/0066* (2013.01); *H01L 2933/0075* (2013.01)

(58) Field of Classification Search
CPC . H01L 2224/16235; H01L 2924/15311; H01L 2924/16195; H01L 2924/19105; G02B 6/4269; G02B 6/4279; G02B 6/428; G02B 6/102; G02B 6/4214; G02B 2006/12069; G11C 16/0416; G11C 11/42; G11C 16/18
See application file for complete search history.

(56) References Cited

U.S. PATENT DOCUMENTS

| | | | |
|---|---|---|---|
| 5,334,555 A | * | 8/1994 | Sugiyama ............ H01L 23/291 438/257 |
| 5,355,016 A | | 10/1994 | Swirbel et al. |
| 5,438,216 A | * | 8/1995 | Juskey .................. G11C 16/18 257/434 |
| 6,121,656 A | | 9/2000 | Tanaka et al. |
| 6,560,764 B1 | * | 5/2003 | Jaengbamrung ............................ G01R 31/318516 716/117 |
| 6,583,645 B1 | | 6/2003 | Bennett et al. |
| 7,245,796 B2 | | 7/2007 | Ouchi |
| 10,274,808 B1 | | 4/2019 | Van Camp |
| 11,043,270 B1 | * | 6/2021 | Libsch .................. H01L 27/115 |
| 2001/0049164 A1 | * | 12/2001 | Widdershoven ...... H01L 27/115 257/E27.103 |
| 2002/0001869 A1 | * | 1/2002 | Fjelstad ............. H01L 21/4832 257/E31.117 |
| 2005/0035357 A1 | * | 2/2005 | Fjelstad ............. H01L 21/4832 257/E21.502 |

* cited by examiner

US 11,476,238 B2

DENSE HYBRID PACKAGE INTEGRATION OF OPTICALLY PROGRAMMABLE CHIP

BACKGROUND

The exemplary embodiments described herein relate generally to semiconductor devices and methods for the fabrication thereof and, more specifically, to dense integrated UV source multichip package structures and assembly methods using 2.5D packaging technology.

One of the first memory packages to accommodate a means of enabling UV light for memory erasure were EPROMS. This was accomplished by providing a "window" on an upper surface of the device package through which program memory was erased by exposure to UV light. Once erased, the memory package could be reprogramed after a programing "burn" and test cycle.

EPROM memory packages use quartz windows or other UV transparent insulator material as the upper surface (topside layer) of the package upon which the integrated circuit is mounted. However, quartz windows are relatively expensive, and other less expensive UV transparent materials do not have the desired high resistance to moisture, hydrogen, and ionic contaminants. For example, EPROM devices are generally manufactured having a UV transparent passivation layer of silicon dioxide mounted on a ceramic package having only a thick quartz window. The passivation layer has relatively poor barrier properties (resistance to moisture, hydrogen, and contaminants). Although such EPROMs may be reliable, fabrication of the ceramic/quartz packaging is often cost-prohibitive. Additionally, the packaging does not scale.

In using UV light for erasure in EPROM memory, the application of the UV light provides a blanket erasure of all memory elements with no selectivity. For example, memory sectors in the EPROM cannot be selectively erased. External UV light sources are usually from mercury-vapor lamps, which are cumbersome, expensive, and do not provide for field erasure or the ability to reprogram the memory after erasure.

Other methods developed as an alternative to UV erasure include EEPROM, which provides an electrical erase function.

BRIEF SUMMARY

In one exemplary aspect, an interconnect for a semiconductor device comprises: a carrier; a UV programmable chip mounted on the carrier using a first array of solder connections; a UV light source mounted on the carrier using a second array of solder connections, the UV light source being in optical communication with the UV programmable chip; and a plurality of transmission lines extending on or through the carrier and providing electrical communication between the UV programmable chip and the UV light source.

In another exemplary aspect, an interconnect for a semiconductor device comprises: a carrier; a UV programmable chip mounted on the carrier using a first array of solder connections; a UV light source mounted on the carrier using a second array of solder connections, the UV light source being in optical communication with the UV programmable chip; a plurality of bond pads on the carrier; and a plurality of transmission lines extending on or through the carrier and providing electrical communication between the UV programmable chip and the UV light source and the plurality of bond pads. The plurality of bond pads is configured for attachment of the carrier to an electrical substrate.

In another exemplary aspect, a method for fabricating an in-field programmable semiconductor device comprises: flip chip bonding a UV light source to a first carrier using a first solder; flip chip bonding a UV programmable chip to the first carrier using a second solder, wherein the UV light source and the UV programmable chip form an in-field programmable chip; attaching the first carrier to an electrical substrate; and connecting at least one heat sink to the in-field programmable chip.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein.

DETAILED DESCRIPTION

Figure 1A:
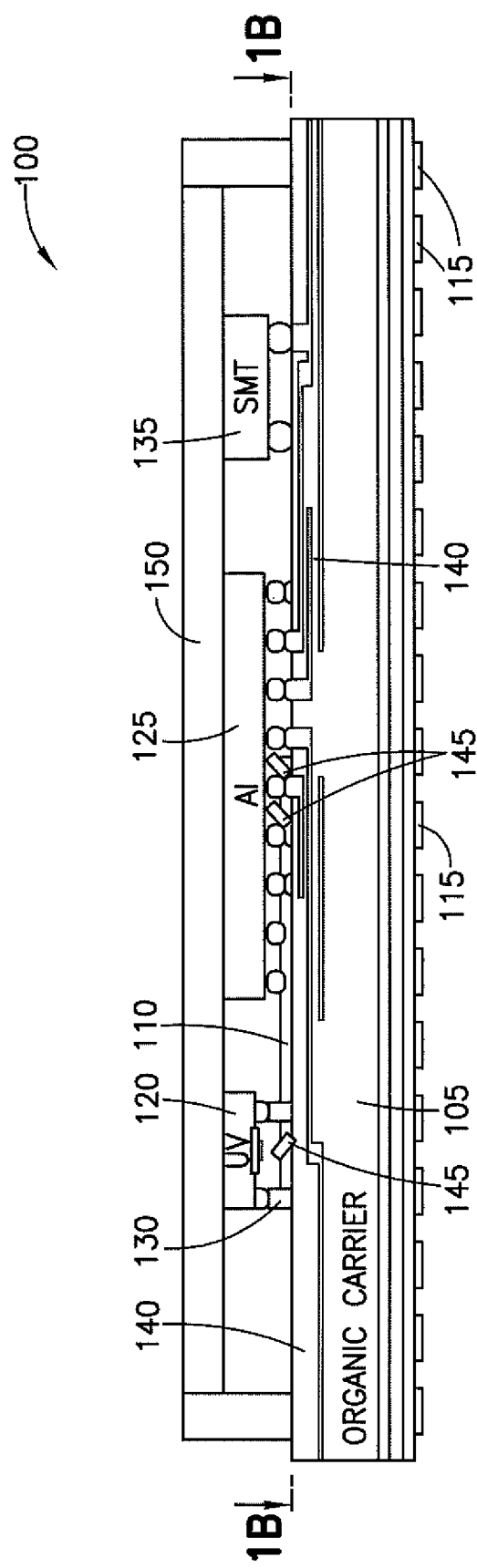
FIG. 1A is a side view of one example embodiment of a second level PCB soldered interconnect showing a UV chip, an AI chip, and an SMT component.

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

Integrated UV source multichip package structures are optically programmable semiconductor devices that range from EPROMS to neuromorphic inference and AI chips. Conventional EPROMS may be UV erasable and capable of removing charge (electrons) from a floating gate, thus making them capable of changing transistor thresholds and memory states. Neuromorphic inference and AI chips, on the other hand, may employ newer emerging materials that rely on UV exposure for the moving or removal of ions to alter resistivity of the structure. Some of the newer emerging materials include, for example, ionic conducting polymers and the like.

In the example embodiments described herein, a UV light source is used for enabling UV erasing (ion resetting) of ionic polymer material. One example of such a UV light source is GaN laser light. GaN is a binary III/V direct bandgap semiconductor material having a Wurtzite crystal structure. It has a wide band gap of 3.4 eV with high heat capacity, high thermal conductivity, and room temperature simulated emission, thus providing several benefits including, but not limited to: high performance and long-lifetime UV laser diodes that operate from the visible band down to the violet band (about 400 nanometers (nm)) without the use of nonlinear optical frequency doubling; low sensitivity to ionizing radiation (similar to other Group III nitrides), thus making it suitable for military and space applications in radiation environments; and operability at much higher temperatures (up to about 400 degrees C.) and workability at much higher voltages than silicon (up to about 1000 volts (V)) or GaAs (in other words, it has a very high breakdown voltage, high electron mobility, and high saturation velocity that results in high Johnson's FoM).

In addition to GaN, AlGaN may also be used as a UV light source. AlGaN is an alloy of AlN and GaN where the bandgap can be tailored from 3.4 eV (xAl=0) operating in the blue to UV region to 6.2 eV (xAl=1) operating at wavelengths down to 250 nm (far UV).

A cost effective integrated package may be produced in which an inference AI chip based on ionic polymer weights is coupled to the GaN light source to enable UV erasing of ionic polymer material. GaN LEDs are fabricated on sapphire and are heterogeneously packaged with other semiconductor chips on the same packaging platform (for example, a silicon carrier used with an organic substrate).

In addition, waveguides such as multi-core polymer waveguides (PWGs) are fabricated and integrated into organic and ceramic package carriers and PCBs to form complete optical links. These optical links are composed of the light source chip coupled to a light path that includes a focusing entry lens, an entry turning mirror (for 90 degree light turning in the plane of the carrier), a PWG, an exit turning mirror (for 90 degree light turning vertically out of the plane of the carrier), and an exit focusing lens to the recipient chip.

Figure 1B:
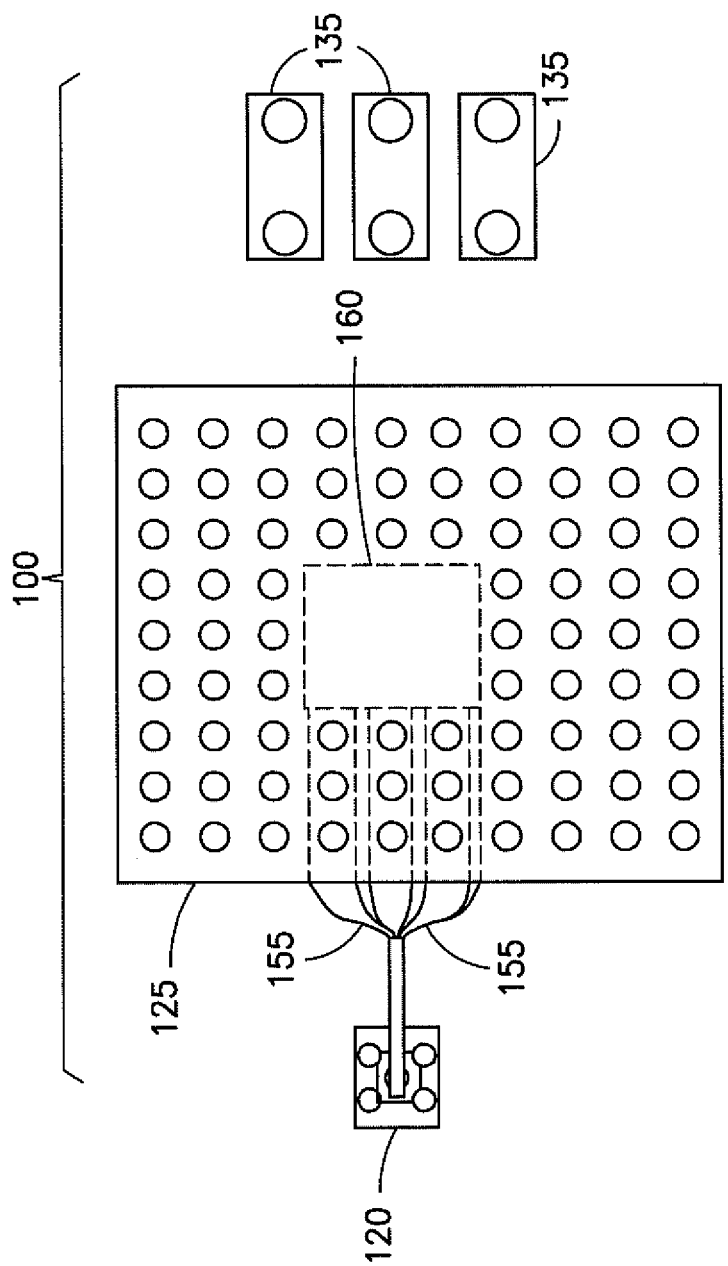
FIG. 1B is a bottom sectional view of the interconnect of FIG. 1A.

Referring to FIGS. 1A and 1B, a PCB soldered interconnect with a PWG distributed UV source is shown generally at 100 and is hereinafter referred to as "interconnect 100." Second level package interconnections include the chip packages, connectors, and other components attached to a board.

As shown in FIG. 1A, interconnect 100 may be used in a multichip package structure and comprises an organic carrier 105 (substrate) on which is mounted a waveguide or PWG 110 and a plurality of pads 115 suitable for surface-mount packaging (BGA/LGA/PGA). A UV light source 120 is mounted on the PWG 110, the UV light source 120 comprising a GaN or AlGaN laser as described above and a lens. In some example embodiments, the laser and lens comprising the UV light source 120 may be an LED chip. A programmable chip 125 (an AI chip is shown) is mounted partially on the PWG 110 and partially on the organic carrier 105. The UV light source 120 and the programmable chip 125 may form an in-field programmable chip.

As shown, the UV light source 120 and the programmable chip 125 may be mounted using C4s in which lead free solder balls (for example SAC (Tin-Silver-Copper)) are used to couple an underside of the programmable chip 125 to the organic carrier 105. The solder balls provide for electrical communication between the UV light source 120 and the programmable chip 125 through transmission lines 140. Electrical vias 130 may be used to facilitate the electrical communication, for example, between the UV light source 120 and the transmission lines 140. Other SMT components 135 may also be mounted on the organic carrier 105 and maintained in communication with on-board and off-board components through the transmission lines 140. Bond pads 115 provide electrical connection with various signal, power and ground lines from the transmission lines 140 to the external printed circuit board via ball grid array (BGA), land grid array (LGA), or pin grid array connectors.

Ablating mirrors 145 are located proximate the UV light source 120 and the programmable chip 125. A TIM between the heat spreader 150 and the components of UV laser 120, the AI chip 125, and any other SMT 135 provides a path for thermal dissipation. The TIM or heat spreader 150 may be hermetically sealed to the other elements of the interconnect 100 in order to ensure optical cleanliness, isolation and non-interference from the environment, and overall reliability.

As shown in FIG. 1B, light pipes 155 (formed by the PWG 110) may optically couple the mirrors 145 proximate the UV light source 120 and an erasable region 160 of the programmable chip 125.

As shown in both FIGS. 1A and 1B, an optical UV illumination path originates at the UV light source 120, passes through either a single or collimating lens, a first of the ablating mirrors 145, and at least one second ablating mirror 145 to the erasable region 160 of the programmable chip 125. Additional lenses/diffusers may be located on the organic carrier 105 and/or programmable chip 125 as desired for illumination, focus, and/or uniformity in routing of the UV light. Although the programmable chip 125 shown in the foregoing exemplary embodiment is an AI chip, any other chip that uses UV exposure to change the conductivity, threshold, or other state of the structures or devices contained therein may be employed in the interconnect 100.

Figure 2:
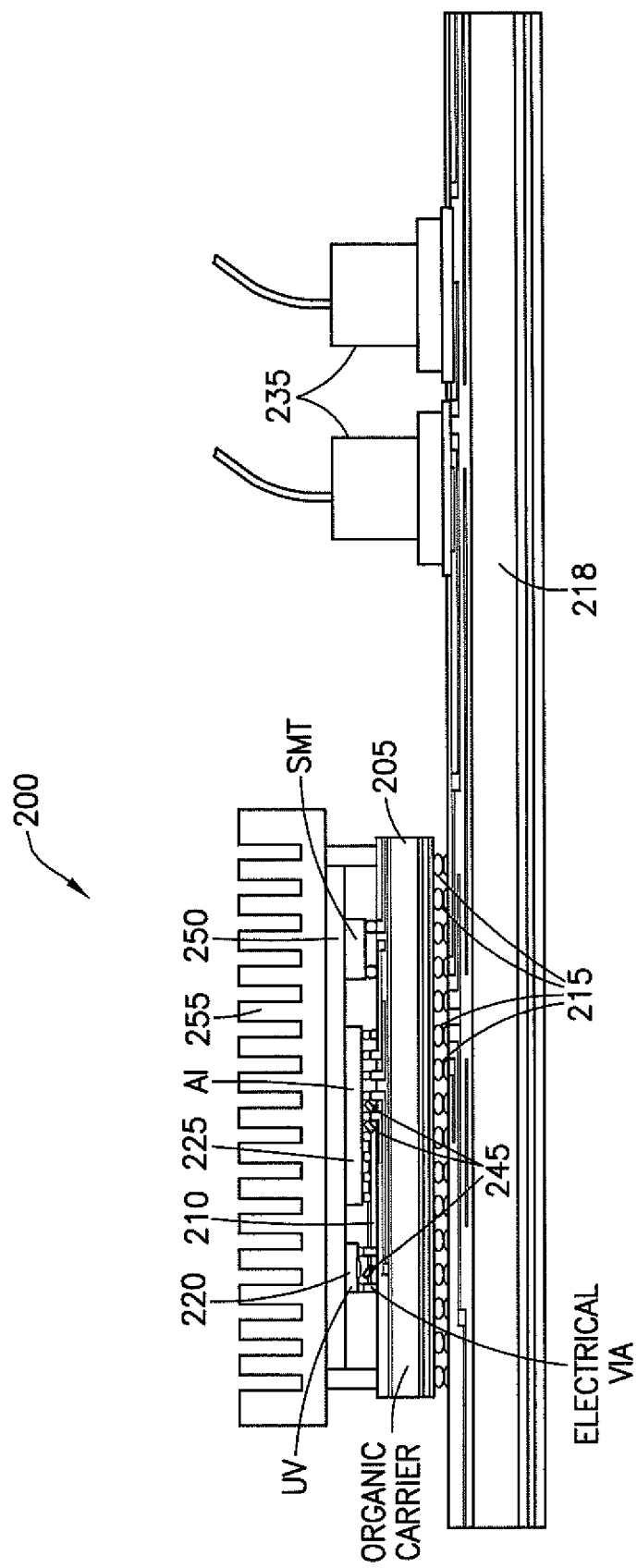
FIG. 2 is side view of one example embodiment of a second level package with C4 flip chip interconnect and with a UV incorporated source.

Referring to FIG. 2, an example embodiment of a second level C4 flip chip interconnect with a UV incorporated source is shown generally at 200 and is hereinafter referred to as "interconnect 200." Interconnect 200 may also be used in a multichip package structure and comprises elements similar to those of interconnect 100, namely, an organic carrier 205 (substrate) on which is mounted a polymer waveguide or PWG 210, a plurality of pads 215 suitable for surface-mount packaging (BGA/LGA/PGA), a UV light source 220, and a programmable chip 225 (an AI chip is shown). The UV light source 220 and the programmable chip 225 may form an in-field programmable chip, which may be mounted to an electrical substrate 218. SMP connectors 235 and/or edge connectors may also be mounted on the electrical substrate 218.

Similar to interconnect 100, the UV light source 220 and the programmable chip 225 may be mounted using a C4s in which lead free solder balls of tin-silver-copper, or SnAgCu (SAC) solder, provide for electrical communication between the UV light source 220 and the programmable chip 225 through transmission lines. Ablating mirrors 245 are located proximate the UV light source 220 and the programmable chip 225. A TIM below and above the heat spreader 250 forms a lid on the interconnect 200 to provide for thermal dissipation. A heat sink 255 having fins is mounted with TIM on the heat spreader 250, at least a portion of the heat spreader 250 being copper. The heat spreader 250 may be hermetically sealed to the other elements of the interconnect 200 in order to ensure optical cleanliness, isolation and non-interference from the environment, and overall reliability.

As with interconnect 100, an optical UV illumination path for interconnect 200 originates at the UV light source 220, passes through either a single or collimating lens, to the ablating mirrors 245, and to an erasable region of the programmable chip 225. Additional lenses/diffusers may be located on the organic carrier 205 and/or programmable chip 225 as desired for illumination, focus, and/or uniformity in routing of the UV light. Although the programmable chip 225 shown in the foregoing exemplary embodiment is an AI chip, any other chip that uses UV exposure to change the conductivity, threshold, or other state of the structures or devices contained therein may be employed in the interconnect 200.

Figure 3:
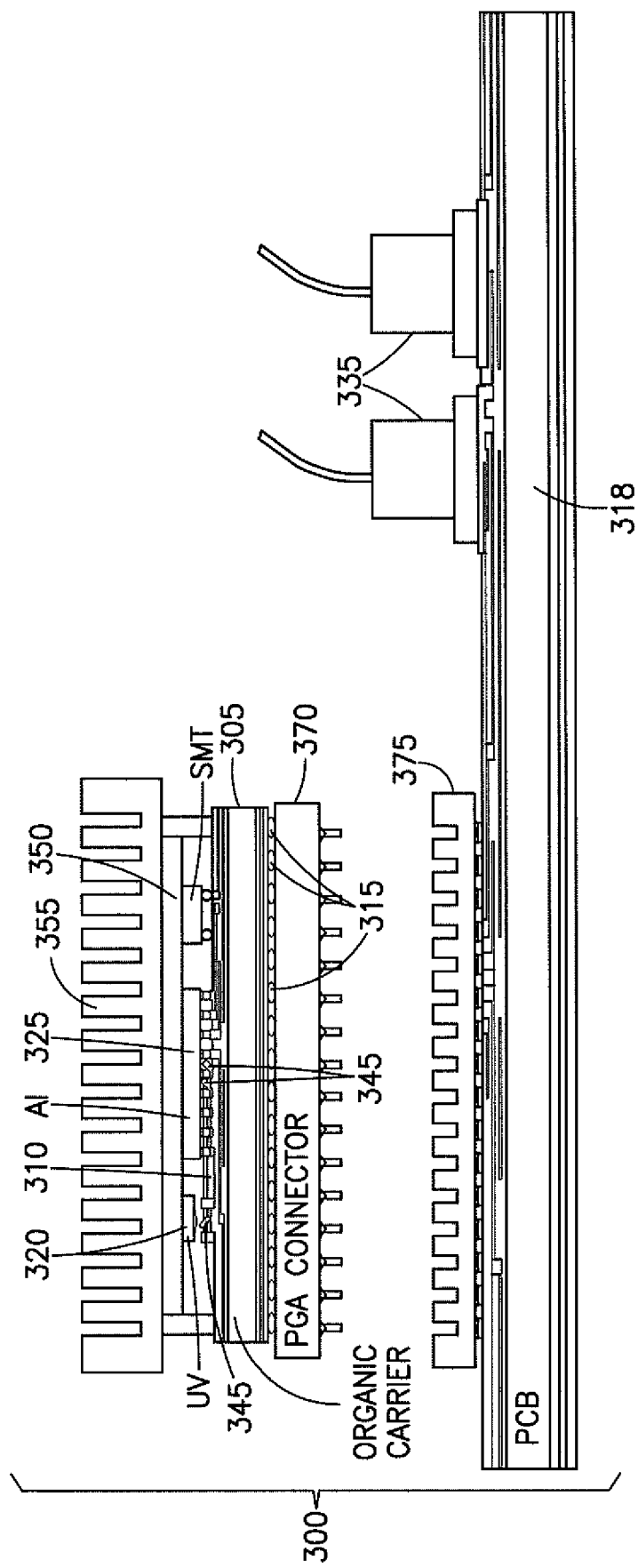
FIG. 3 is a side view of one example embodiment of a second level package with field replaceable interconnect and with a UV incorporated source.

Referring to FIG. 3, one example embodiment of a second level C4 flip chip field replaceable interconnect with a UV incorporated source is shown generally at 300 and is hereinafter referred to as "interconnect 300." Interconnect 300 may also be used in a multi-chip package structure and comprises elements similar to those of interconnect 100 and interconnect 200, namely, an organic carrier 305 (substrate) on which is mounted a polymer waveguide or PWG 310, a plurality of pads 315 suitable for surface-mount packaging (BGA/LGA/PGA), a UV light source 320 (such as an LED chip), and a programmable chip 325 (an AI chip is shown). The UV light source 320 and the programmable chip 325 may form an in-field programmable chip.

Similar to interconnects 100 and 200, the UV light source 320 and the programmable chip 325 may be mounted using C4s with tin-silver-copper (SAC) solder to provide for electrical communication between the UV light source 320 and the programmable chip 325 through transmission lines. Ablating mirrors 345 are located proximate the UV light source 320 and the programmable chip 325. As with interconnect 200, a TIM is applied above and below the heat spreader 350 that forms a lid on the interconnect 300 to provide for thermal dissipation. A heat sink 355 having fins is mounted on the TIM above the heat spreader 350, at least a portion of the heat spreader 350 being copper. The heat spreader 350 may be hermetically sealed around the other elements of the interconnect 200 in order to ensure optical cleanliness, isolation and non-interference from the environment, and overall reliability.

As shown, the interconnect 300 is mounted to a male portion 370 of a pin grid array (PGA) connector which may be received into a female portion 375 of the PGA connector mounted on a PCB 380. SMP connectors 335 and/or edge connectors may be mounted on the PCB 318.

In any of the foregoing example embodiments, a portion of the programmable chip 125, 225, 325 may be fabricated of a spiropyran or similar organic compound having photochromic properties. Spiropyrans undergo reversible structural changes upon exposure to radiation. In a spiropyran, a closed ring structure is converted to an open zwitterionic compound upon exposure to UV radiation. This conversion is reversible, in other words, the open structure can be returned to a closed form by exposure to visible radiation or heat. Due to the ease of transformation of spiropyrans from closed neutral molecules to open ionic molecules, these materials can be useful for electrostatic gating of transistors when used in conjunction with graphene, carbon nanotubes, and/or polymer composites as channel materials. In particular, reprogrammable neuromorphic inference arrays may be fabricated (1) using photochromic materials with semiconducting polymers as channel materials and by resistive heating to program the resistivity of two terminal devices; or (2) changing the resistivity (of a two terminal device) or the threshold voltage (of a three terminal device) of a silicon channel by application a thin film of spiropyran or its polymer composite.

Figure 4:
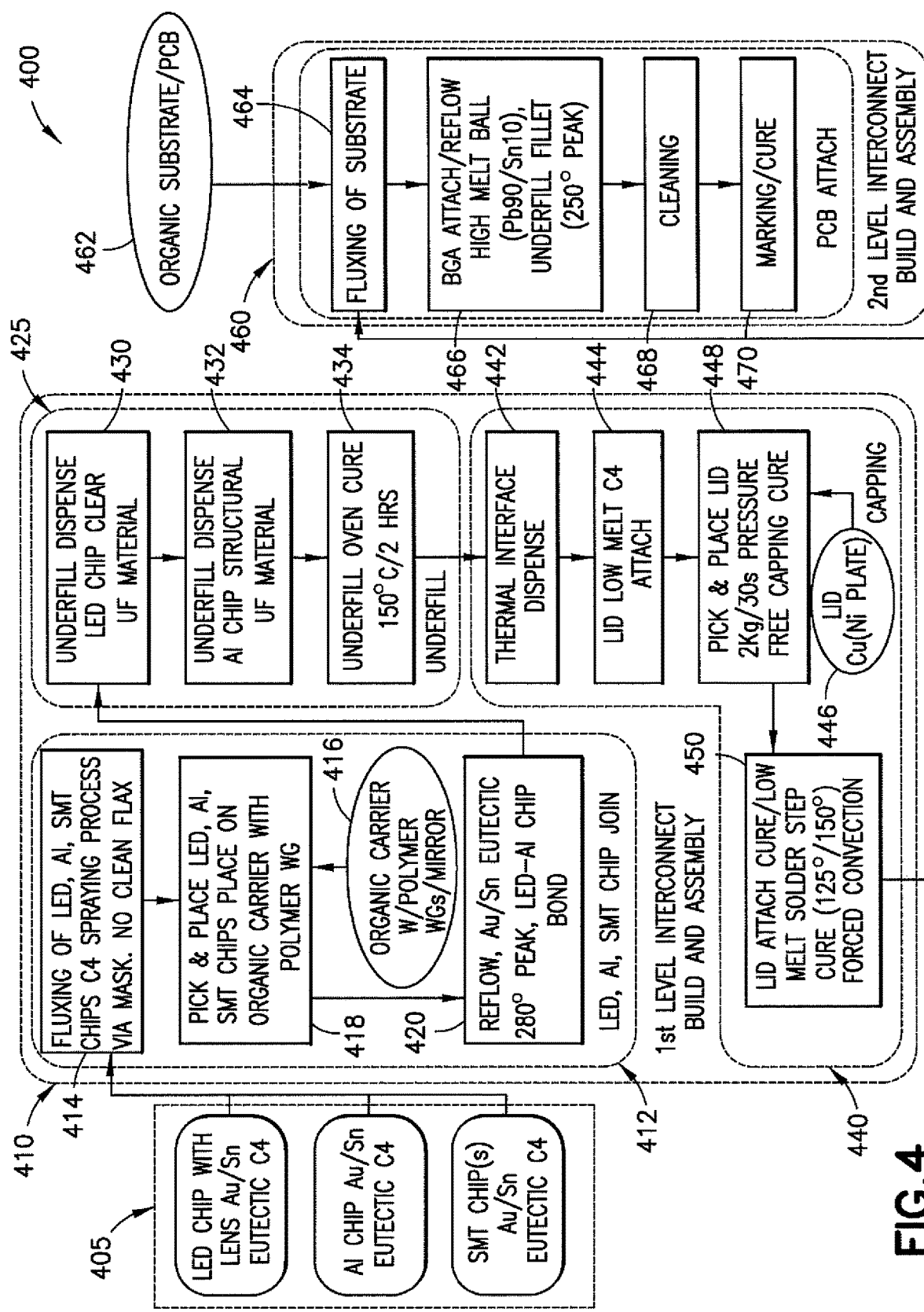
FIG. 4 is a flow chart illustrating one example process of a method of assembling a hybrid package comprising a UV laser source and an optically programmable AI chip module.

Referring to FIG. 4, a method of assembling a dense hybrid package comprising a UV laser source and an optically programmable AI chip module as a card is shown at 400 and is hereinafter referred to as "method 400." In method 400, a UV laser source (such as an LED chip having a lens), an AI chip, and at least one SMT component is provided as indicated at 405. The chips and components may be coupled to a provided organic carrier substrate using C4 or flip chip interconnection technology and a hard solder alloy suitable for optoelectronic applications, such solder alloy including, but not limited to eutectic Au/Sn.

In the method 400, a first level interconnect build and assembly step is shown at 410 and is hereinafter referred to as "first level assembly 410." In the first level assembly 410, a first step is a chip join process 412. Chip join process 412 comprises a fluxing step 414 using the LED chip, AI chip, and SMT component(s) from the step 405 in which such chips and component(s) were provided. The fluxing step 414 involves a C4 spraying process using a mask. From the fluxing step 414, the carrier substrate (and mirrors) is provided in a substrate providing step 416, and a pick/place step 418 is carried out in which the LED chip, the AI chip, and the SMT component are placed on the carrier substrate using a polymer waveguide. From the pick/place step 418, a reflow step 420 is carried out in which the LED chip and the AI chip are bonded to the substrate using the eutectic Au/Sn (or other alloy) at about 280 degrees C.

After the chip join process 412, an underfill process 425 is carried out. In the underfill process 425, a first underfill dispense step 430 is carried out in which underfill is dispensed to the LED chip using the clear UF material. From the first underfill dispense step 430, a second underfill dispense step 432 is carried out in which structural OF material (such as epoxy material) is applied. Following the second underfill dispense step 432, an underfill cure step 434 is carried out at 150 degrees C. for two hours to cure the underfill material.

After the underfill process 425, a capping process 440 is carried out. From the underfill cure step 434, a thermal interface dispense step 442 is carried out, followed by a LID low melt C4 attach step 444 in which a lid is metallurgically attached via the C4 attach step 444 to the metal pads on the organic package. The LID low melt C4 attach step 444, in conjunction with a lid providing step 446 in which a copper or nickel plate is provided, leads to a pick/place lid step 448 in which two kilograms of pressure is applied for 30 seconds followed by a free capping cure. In the free capping cure, a force is applied near the distal ends of the lid or substrate to cause a center portion of the lid or substrate to bow away from the semiconductor chip. The central thickness of the thermal interface material prior to curing is increased. While the center portion of the lid or substrate is bowed away from the semiconductor chip, the temperature of the assembly is increased, thus curing the thermal interface material and lid adhesive. After the thermal material and the adhesive have cured, the method removes the force from near the distal ends of the lid or substrate to cause the center portion of the lid to return to a position closer to the semiconductor chip, thereby creating a residual compressive stress in the thermal interface material thus improving thermal performance and thermal reliability. After the pick/place lid step 448 and the free capping cure, a lid attach cure/low melt solder step 450 is carried out in which a curing occurs in a first step at 125 degrees C. and a second step at 150 degrees C. in a forced convention oven. The first level assembly 410 is concluded.

A second level interconnect build and assembly step is then carried out as shown at 460. This assembly step is hereinafter referred to as "second level assembly 460." In the second level assembly 460, an organic substrate/PCB is provided as shown at 462 and fluxing of the substrate is carried out at a fluxing step 464. After the fluxing step 464, a BGA attach/reflow step 466 is carried out. In this BGA attach/reflow step 466, a high melt ball (Pb90/Sn10) and an underfill fillet are applied at 250 degrees C. A cleaning step 468 is then carried out, followed by a marking/cure step 470. The PCB is thereby attached, and the second level assembly 460 is concluded.

The chip bonding and assembly packaging methods as described above are compatible with higher throughput wafer-to-wafer, chips-to-wafer, and chips-to-chips parallel assembly processes. More particularly, the bonding and assembly packaging methods as described herein may use existing microfabrication tooling to enable scalability to smaller integrated UV source on system package dimensions beyond what is capable with current 2.5D packages.

In addition, other advantages of the UV LED source packaging and assembly methods described herein include, but are not limited to:

Compatibility with parallel aligned multi-chip pick and place, enabling higher throughput process compared to conventional serial chip handling, resulting in lower cost;

Bonding hierarchy compatible with different chip technologies (for example, GaN UV LED chips and silicon AI system chips with programmable ionic conducting polymer weights, etc.);

Enables chip on system bond and assembly size scaling to smaller package dimensions than what is possible with the conventional 2.5D package;

Enables precise (sub-micron) assembly as needed by UV source chip by employing the higher yielding and higher accuracy microfabrication alignment tools rather than the conventional packaging area tools after wafer fabrication;

Assembly process produces hermetically metal sealed package without additional processing or expensive ceramic package;

Integrated UV Source inside of package eliminates conventional expensive ceramic package with quartz window;

Enables sub-partition of chip area and dose UV exposure (not just blanket UV exposure); and/or Enables in-field and reconfigurable UV exposure.

Referring now to all the Figures, in one exemplary embodiment, an interconnect for a semiconductor device comprises: a carrier; a UV programmable chip mounted on the carrier using a first array of solder connections; a UV light source mounted on the carrier using a second array of solder connections, the UV light source being in optical communication with the UV programmable chip; and a plurality of transmission lines extending on or through the carrier and providing electrical communication between the UV programmable chip and the UV light source.

The interconnect may further comprise a polymer wave guide through which the optical communication between the UV light source and the UV programmable chip is carried out. The interconnect may further comprise at least two mirrors through which the optical communication is carried out. At least one of the UV programmable chip and the UV light source may be mounted using a C4 flip chip interconnect. The UV programmable chip and the UV light source form an in-field programmable chip. The interconnect may further comprise a lid mounted over the UV programmable chip and the UV light source, wherein the lid comprises a heat dissipation device. The UV programmable chip may comprise a spiropyran.

In one example, an interconnect for a semiconductor device comprises: a carrier; a UV programmable chip mounted on the carrier using a first array of solder connections; a UV light source mounted on the carrier using a second array of solder connections, the UV light source being in optical communication with the UV programmable chip; a plurality of bond pads on the carrier; and a plurality of transmission lines extending on or through the carrier and providing electrical communication between the UV programmable chip and the UV light source and the plurality of bond pads. The plurality of bond pads is configured for attachment of the carrier to an electrical substrate.

At least one of the UV programmable chip and the UV light source may be mounted using a C4 flip chip interconnect. The plurality of bond pads may be configured to attach to a printed circuit board. The plurality of bond pads may be coupled to a male portion of a connector, and the male portion of the connector may be configured to be coupled to a female portion of the connector, and the female portion of the connector may be configured to attach to a printed circuit board. The UV programmable chip and the UV light source may form an in-field programmable chip. The UV programmable chip may comprise a spiropyran.

In another example, a method for fabricating an in-field programmable semiconductor device comprises: flip chip bonding a UV light source to a first carrier using a first solder; flip chip bonding a UV programmable chip to the first carrier using a second solder, wherein the UV light source and the UV programmable chip form an in-field programmable chip; attaching the first carrier to an electrical substrate; and connecting at least one heat sink to the in-field programmable chip.

Attaching the first carrier to the electrical substrate may comprise using a third solder having a melting point less than a melting point of the first solder and less than a melting point of the second solder. The method may further comprise attaching a lid over the UV programmable chip and the UV light source, wherein the lid comprises a heat dissipation device.

LIST OF ABBREVIATIONS

AI artificial intelligence
BGA ball grid array
C4 controlled collapse chip connection
EPROM erasable programmable read-only memory
EEPROM electrical erasable programmable read-only memory
LED light emitting diode
LGA land grid array
PCB printed circuit board
PGA pin grid array
PWG polymer wave guide
SAC tin-silver-copper
SMP sub-miniature push-on
SMT surface mount technology
UF underfill
UV ultraviolet In the foregoing description, numerous specific details are set forth, such as particular structures, components, materials, dimensions, processing steps, and techniques, in order to provide a thorough understanding of the exemplary embodiments disclosed herein. However, it will be appreciated by one of ordinary skill of the art that the exemplary embodiments disclosed herein may be practiced without these specific details. Additionally, details of well-known structures or processing steps may have been omitted or may have not been described in order to avoid obscuring the presented embodiments. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The description of the present invention has been presented for purposes of illustration and description, but is not intended to be exhaustive or limiting in the form disclosed. Many modifications and variations will be apparent to those of ordinary skill in the art without departing from the scope of the invention. The embodiments were chosen and described in order to best explain the principles of the invention and the practical applications, and to enable others of ordinary skill in the art to understand the invention for various embodiments with various modifications as are suited to the particular uses contemplated.

What is claimed is:

1. An interconnect for a semiconductor device, the interconnect comprising:
   a carrier;
   a UV programmable chip mounted on the carrier using a first array of solder connections;
   a UV light source mounted on the carrier using a second array of solder connections, the UV light source being in optical communication with the UV programmable chip; and
   a plurality of transmission lines extending on or through the carrier and providing electrical communication between the UV programmable chip and the UV light source.

2. The interconnect of claim 1, further comprising a polymer wave guide through which the optical communication between the UV light source and the UV programmable chip is carried out.

3. The interconnect of claim 1, further comprising at least two mirrors through which the optical communication is carried out.

4. The interconnect of claim 1, wherein at least one of the UV programmable chip and the UV light source is mounted using a C4 flip chip interconnect.

5. The interconnect of claim 1, wherein the UV programmable chip and the UV light source form an in-field programmable chip.

6. The interconnect of claim 1, further comprising a lid mounted over the UV programmable chip and the UV light source, wherein the lid comprises a heat dissipation device.

7. The interconnect of claim 1, wherein the UV programmable chip comprises a spiropyran.

8. An interconnect for a semiconductor device, the interconnect comprising:
   a carrier;
   a UV programmable chip mounted on the carrier using a first array of solder connections;
   a UV light source mounted on the carrier using a second array of solder connections, the UV light source being in optical communication with the UV programmable chip;
   a plurality of bond pads on the carrier; and
   a plurality of transmission lines extending on or through the carrier and providing electrical communication between the UV programmable chip and the UV light source and the plurality of bond pads;
   wherein the plurality of bond pads is configured for attachment of the carrier to an electrical substrate.

9. The interconnect of claim 8, wherein at least one of the UV programmable chip and the UV light source is mounted using a C4 flip chip interconnect.

10. The interconnect of claim 8, wherein the plurality of bond pads is configured to attach to a printed circuit board.

11. The interconnect of claim 8, wherein the plurality of bond pads is coupled to a male portion of a connector, and wherein the male portion of the connector is configured to be coupled to a female portion of the connector, and wherein the female portion of the connector is configured to attach to a printed circuit board.

12. The interconnect of claim 8, wherein the UV programmable chip and the UV light source form an in-field programmable chip.

13. The interconnect of claim 8, wherein the UV programmable chip comprises a spiropyran.

14. A method for fabricating an in-field programmable semiconductor device, the method comprising:
   flip chip bonding a UV light source to a first carrier using a first solder;
   flip chip bonding a UV programmable chip to the first carrier using a second solder, wherein the UV light source and the UV programmable chip form an in-field programmable chip;
   attaching the first carrier to an electrical substrate; and
   connecting at least one heat sink to the in-field programmable chip.

15. The method of claim 14, wherein attaching the first carrier to the electrical substrate comprises using a third solder having a melting point less than a melting point of the first solder and less than a melting point of the second solder.

16. The method of claim 14, further comprising attaching a lid over the UV programmable chip and the UV light source, wherein the lid comprises a heat dissipation device.

* * * * *